United States Patent [19]

Hoyle et al.

[11] 4,037,102
[45] July 19, 1977

[54] THIN-FILM SUPERCONDUCTOR DEVICE

[75] Inventors: John A. Hoyle, Huntsville, Ala.;
Robert R. Humphris; John W. Boring,
both of Charlottesville, Va.

[73] Assignee: University of Virginia,
Charlottesville, Va.

[21] Appl. No.: 617,580

[22] Filed: Sept. 29, 1975

[51] Int. Cl.$^2$ .............................................. G01T 1/24
[52] U.S. Cl. ..................................... 250/336; 250/370
[58] Field of Search ........................ 250/336, 370, 371

[56] References Cited

U.S. PATENT DOCUMENTS 3,691,381  9/1972  Kleppner ............................. 250/370
3,772,520  11/1973  Varker ................................. 250/371

Primary Examiner—Archie R. Borchelt
Attorney, Agent, or Firm—Oblon, Fisher, Spivak, McClelland & Maier

[57] ABSTRACT

A thin-film superconductor device is disclosed which includes a superconductor film having one or more channels or regions of reduced width. The channel areas define predetermined volumes of superconductive material which is switched from its superconducting state to its normal state by impinging low energy particles. Return to the superconducting state is automatic after a fixed interval depending upon the volume of superconductive material in each channel region. The switching or state changing of the semiconductive region is independent of the energy of the triggering particles and results in output pulses of fixed height and width for a given channel volume. Applications of the disclosed superconductor device in digital memories and particle counting apparatuses are described.

20 Claims, 11 Drawing Figures

THIN-FILM SUPERCONDUCTOR DEVICE

BACKGROUND OF THE INVENTION

1. Field of the Invention

The present invention relates to thin-film superconductive devices and more particularly to thin-film superconductive devices having superconductive films of varying volume per unit length.

2. Description of the Prior Art

Considerable research has been devoted to studying the properties of thin-film superconductors. In particular attention is directed to U.S. Pat. No. 3,691,381 to Kleppner, issued Sept. 12, 1972. This patent discloses a low energy superconducting particle counter including a superconductive thin-film in thermal contact with a sapphire substrate. A bias current is passed through the film to maintain the film at an operating point just below its critical current. Incident particles of sufficient energy induce regeneration causing the entire film, or at least a portion of the film, to go normal resulting in a IR drop across the film which produces a detectable output pulse.

This reference describes a first system in which an entire film is driven normal by impinging particles, at which time the film can be returned to its superconducting state only by briefly interrupting the bias current. The reference also describes in much less detail a system which does not require an entire film to be driven to its normal state, and which operates with only a portion of the film being driven normal by impinging particles. The latter technique involves the use of a persistent current in a superconducting loop. The magnetic energy stored inductively in the loop may be monitored, and dissipation of the magnetic energy would indicate that the loop has been driven out of the superconducting state by the impingement of a particle.

The device disclosed in the Kleppner patent, although useful in many applications, is sensitive to the energy of impinging particles and other factors and thus is not suitable for digital applications. Furthermore, the device disclosed in the Kleppner reference lacks parameters which can be adjusted to modify or regulate its performance for various different types of applications. In addition, although the Kleppner apparatus is described as a "low energy" particle counter, the apparatus is in reality incapable of detecting particles having energies below the Mev range. Thus it is not capable of detecting particles of extremely low energy.

A superconducting thin-film detector is also described in a paper by Crittenden and Spiel published in the *Journal of Applied Physics*, Vol. 42, No. 8, pp. 3182–3188 (July 1971). This device is quite similar to that disclosed in the Kleppner patent and it does not include any features which would eliminate the above-mentioned deficiencies in the Kleppner apparatus. In particular, both the Crittenden and Spiel article and the Kleppner patent appear to assume the desirability of providing a thin-film superconductor of essentially constant width along its entire length. The present invention, as will be explained subsequently, does not rely upon this assumption and in fact utilizes a thin-film superconductor of varying volume per unit length in which the volume variations are controlled to provide greater particle detecting sensitivity and controlled digital output signals.

SUMMARY OF THE INVENTION

Accordingly, one object of the present invention is to provide a novel thin-film superconductive apparatus.

Another object of the present invention is to provide a thin-film superconductive device including limited areas adapted to be switched from a superconducting to a normal state upon receiving a pre-determined minimum energy.

Yet another object of the present invention is the provision of a novel superconducting device including a thin-film of varying volume per unit length defining at least one channel portion which may be switched from a superconducting to a normal state upon receipt of a pre-determined minimum energy.

A still further object of the present invention is the provision of a novel superconducting thin-film particle detector capable of detecting discrete particles having extremely low energies.

A still further object of the present invention is the provision of a novel superconducting thin-film particle detector capable of detecting both charged and uncharged particles.

Yet another object of the present invention is the provision of a novel thin-film superconducting device which can be used as a self-erasing digital memory.

A still further object of the present invention is the provision of a self-erasing digital memory utilizing a superconductive element including a thin-film having a plurality of channel portions which are switched from the superconductive state to the normal state upon the incidence thereon of small energy quanta.

Briefly, these and other objects of the invention are achieved by the provision of a superconducting thin-film of non-uniform width. More particularly, the thin-film is formed to include one or more channel regions of reduced width or reduced volume per unit length each of which defines a predetermined total volume of superconductive material. This volume of superconductive material is switched from a superconducting state to a normal state upon receiving a predetermined minimum amount of thermal energy, as by the impingement of atomic particles, for example. The resulting switching of the channel portions causes a step change in the resistance of the thin-film strip which is detectable by monitoring current flow through the superconductive strip. Switching from the superconductive state to the normal state is automatically reversed by the dissipation of the small quantity of thermal energy which initially caused the channel region to switch to its normal condition.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
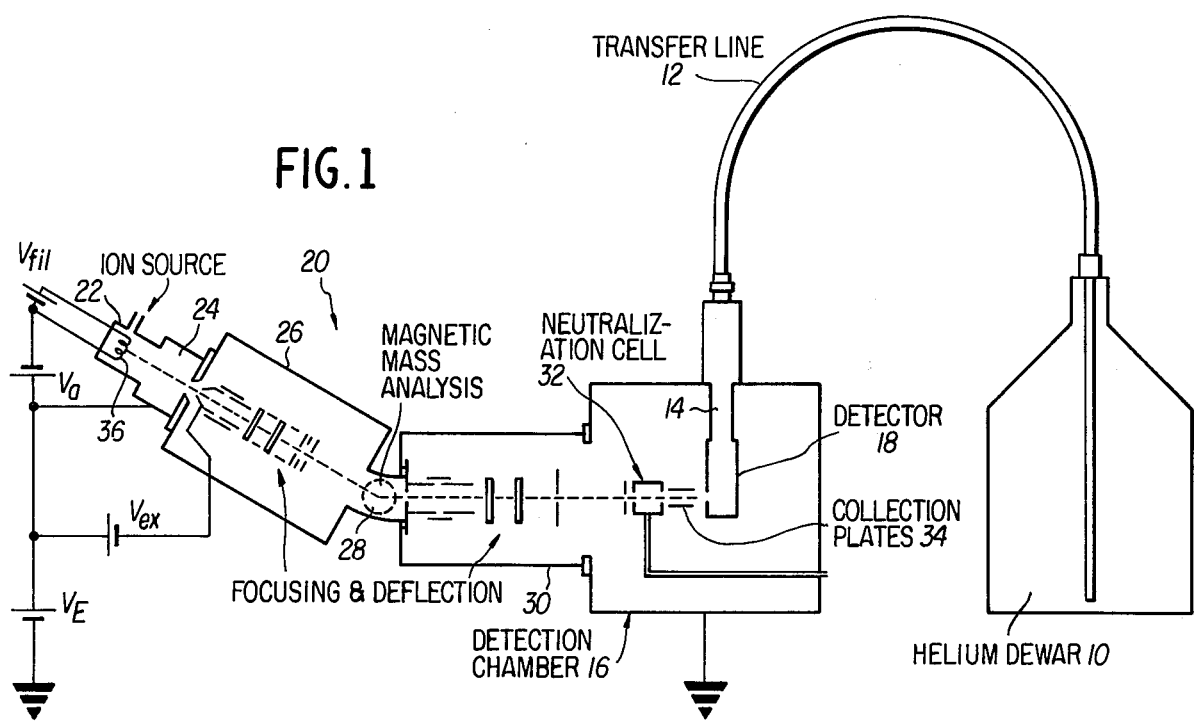
FIG. 1 is a schematic illustration of the apparatus of the present invention including a particle source and superconductive cooling system.

Referring now to the drawings, wherein like reference numerals designate identical or corresponding parts throughout the several views, and more particularly to FIG. 1 thereof, an experimental apparatus is illustrated as including a helium dewar 10, representing a conventional cryogenic system such as a model LT-3-110 liquid helium transfer system commercially built by Air Products Corporation. Such a system provides refrigeration capability from 2° K to 300° K by a controlled transfer of liquid helium from storage vessels such as the helium dewar 10 through a transfer line 12 to a cryotip 14 within a detection chamber 16. A detector 18 constructed in accordance with the principles of the present invention is mounted on the cryotip 14 and is maintained in a supercooled state by the cryotip.

A molecular beam apparatus generally designated by the reference numeral 20 is provided to produce a particle beam which is directed against the detector 18. The molecular beam apparatus is composed of conventional components including an ion source 22 having accelerating electrodes 24, a first focusing and deflection apparatus 26, a magnetic mass analysis unit 28, a second focusing and deflection apparatus 30 coupled to the detection chamber 16, a neutralization cell 32 positioned to intercept the beam before it reaches the detector 18, and a pair of collection plates 34 positioned between the neutralization cell and the detector. Suitable potential sources denoted by $V_{fil}$, $V_a$, $V_{ex}$ and $V_e$ are provided for energizing the ion-producing filament, accelerating the ions and extraction of positive ions. In operation, electrons emitted by a filament 36 are accelerated by accelerating electrodes 24 through an atmosphere of a selected gas, such as helium, argon or some other suitable gas, to produce positive gaseous ions. The positive ions are extracted by means of the negative electrostatic potential $V_{ex}$ and are directed through the electrostatic focusing and deflection unit 26 to the magnetic mass analysis unit 28 which enables selection of the desired argon or helium ions depending upon the gas source used. The ions are then decelerated to the desired energy level through the focusing and deflection unit 30 and passed through the neutralization cell 32 where they may selectively undergo a charge transfer process with a neutralizing gas, thus returning the ion beam to an electrically neutral state. Ions not neutralized in the cell 32 may be removed from the beam by collector plates 34. The properly neutralized and filtered beam subsequently impinges upon the detector 18.

Figure 2:
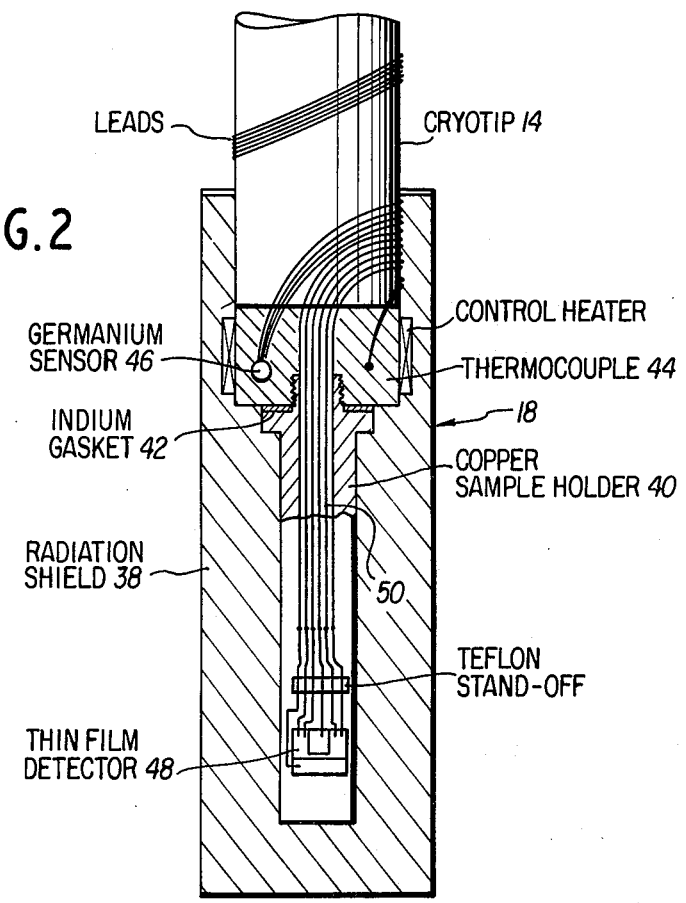
FIG. 2 is an enlarged plan view of a portion of the apparatus illustrated in FIG. 1 showing the thin-film device coupled to the tip of the supercooling apparatus.

Attention is now directed to FIG. 2 which illustrates in greater detail the structure of the detector 18 and its coupling to cryotip 14. The detector 18 includes a thermal or heat radiation shield 38 which also provents unwanted transmission of the ion beam. A copper sample holder 40 is threaded into the base of cryotip 14 and is sealed with an indium gasket 42. A thermocouple 44 and a germanium sensor 46 are provided for temperature monitoring at the base of cryotip 14. A thin-film detector 48 constructed in accordance with the principles of the present invention is mounted near the lower end of sample holder 40 and is provided with a plurality of bias current and monitoring leads 50.

Figure 3:
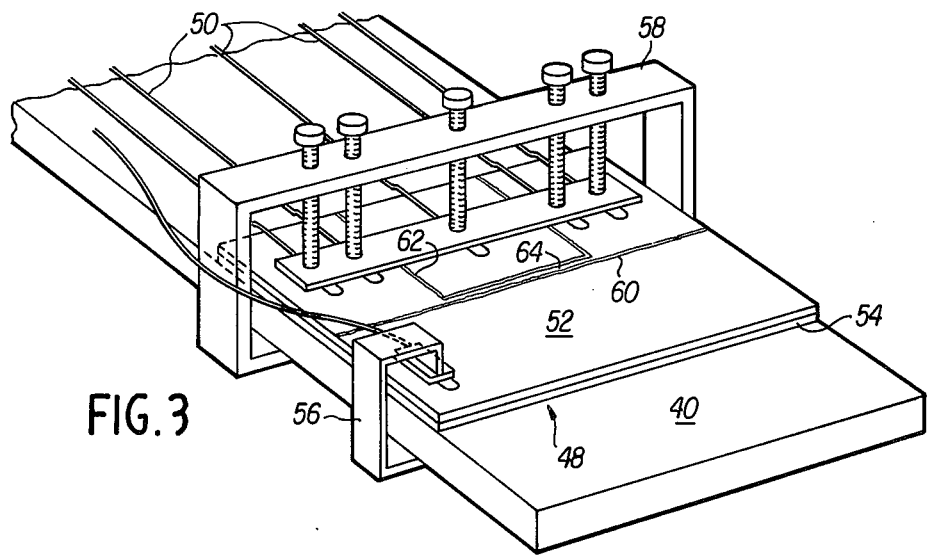
FIG. 3 is an enlarged perspective illustration of the thin-film sample of FIG. 2 illustrating in detail the electrical contacts thereto.

Referring now to FIG. 3 the details of the thin-film detector 48 are shown in greater detail. The superconductive thin-film detector preferably consists of a tinindium film 52 of approximately 500° A thickness evaporated on a glass slide or suitable substrate 54. Other conventional superconductive materials can, of course, be used in the practice of the present invention, as will be apparent to those skilled in the art. The thickness of the film may be varied to adjust the properties of the detector, as will be explained in greater detail subsequently.

The thin-film detector 48 is glued with a good quality low temperature adhesive, such as GE 7031 varnish, or otherwise secured to the sample holder 40. Copper clamps 56 and 58 are shown clamping electrical leads to the thin-film detector, although other conventional methods of securing leads at superconductive temperatures may also be used.

The film 52 includes a first substantially straight scratch 60 and a second substantially U-shaped scratch 62 which includes a portion substantially parallel to the scratch 60 whereby a narrow detecting strip 64 is formed in the film 52. The detecting strip is illustrated in more detail in FIG. 5. Although scratching is described as one technique of forming the detecting strip 64, other techniques including ion-milling, photo-etching and selective deposition techniques can also be used, as will be explained in more detail subsequently.

Figure 4:
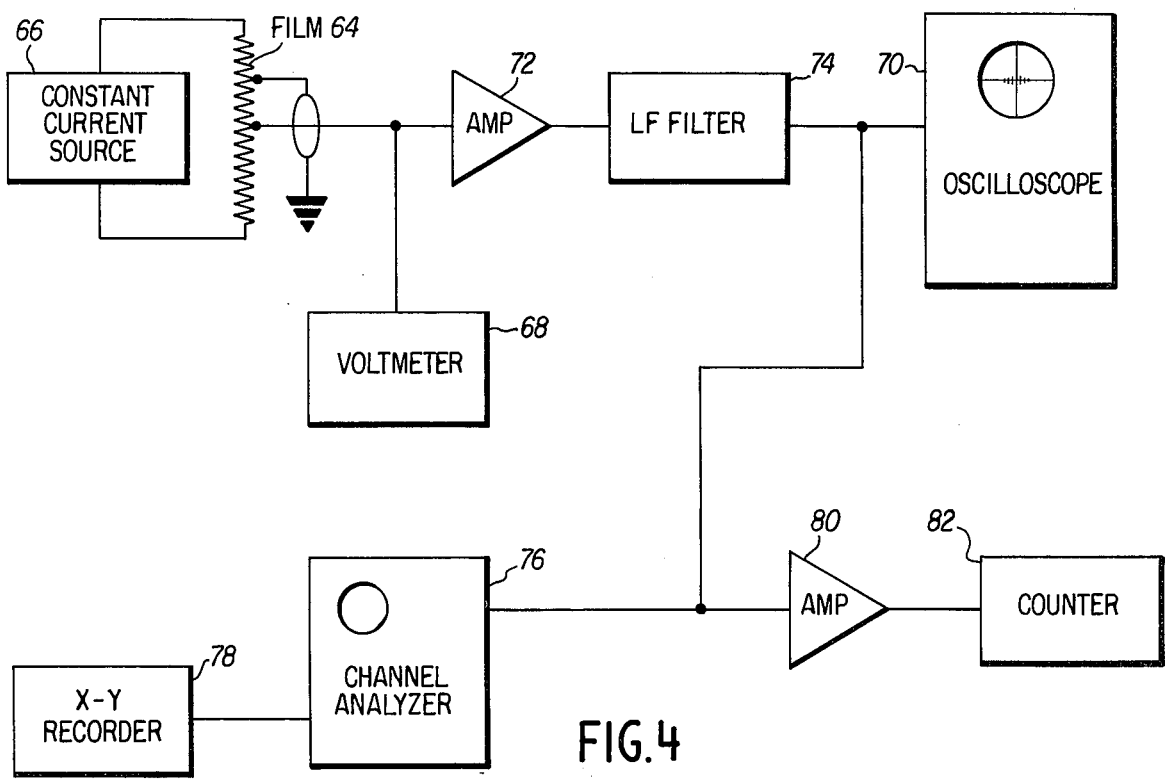
FIG. 4 is a block diagram of the detection circuit of the present invention.

Referring now to FIG. 4, the detection circuit used to monitor the behavior of detecting strip 64 is illustrated. The detection circuit includes a low-noise constant current source 66 coupled across the film 52 such that the current passes through the detecting strip 64. A meter 68, such as a Keithley model 160 digital multimeter is coupled to the detecting strip 64 to monitor the output thereof. An oscilloscope 70 is also coupled to the film 64 through a low-noise amplifier 72 and a low-frequency filter 74. A channel analyzer 76 and an XY recorder 78 are also coupled to the output of the amplifier and low-frequency filter as are a second amplifier 80 and a counter 82. The detection circuit operates such that a constant current is passed through the film 52, and in particular through the detecting strip 64. The voltage drop across the film is substantially zero due to the fact that the resistance of the film is normally essentially zero when the film is in its superconducting state. The resistance, and accordingly the voltage drop, will remain substantially zero provided the temperature of the detecting strip is not raised above the critical temperature $T_c$ and the critical current density for the strip is not exceeded. When regions of the detecting strip are driven normal by impinging particles, the resistance of the film increases and a detectable voltage drop occurs.

For the film 52 to operate properly as a sensitive particle detector, its temperature must be maintained near the critical temperature for the superconductive material being used. Accordingly, accurate temperature regulation over long periods of time is important. Temperature controllers of suitable accuracy for performing the required function are known and are described by J. D. Lindsay in the *Review of Scientific Instruments*, Vol. 39, p. 1192 (1966) and by J. W. Ekin and D. K. Wagner in Vol. 41 of the same publication at pg. 1109 (1970). Such controllers are coupled to the germanium sensor 46 illustrated in FIG. 2 and are capable of controlling the temperature at the cryotip cold end to $\pm 0.001°$ K. This accuracy in controlling the temperature of the cryotip and the attached thin-film detector is sufficient to permit accurate and reproducible operation of the detector.

Attention is again directed to FIG. 5 which is illustrative of the type of detecting strips initially produced in developing the concepts of the present invention. The illustrated detecting strip is irregular in shape as it was formed by a scratching technique. More particularly, the illustrating detecting strip was initially formed by depositing a first layer of tin 425A thick, on top of which a 75A layer of indium was deposited, forming a 500A thick tin-indium alloy composed of 15% indium. Diffusion of the two materials at normal atmospheric pressure and room temperature resulted in the formation of a true alloy. This film was then scratched under a microscope using a fine point of etched niobium, for example, attached to a micromanipulator. The scratching procedure is, of course, imprecise and results in the irregular width pattern of the detecting strip 64. The nominal width of the detecting strip 64 is somwhat less than approximately $5\mu$. However, the variations in the width of the strip include narrow necks or channels 84 and 86, the width of which varies in the range of $1\mu$. It will be understood, of course, that the listed width dimensions are only exemplary. These channel regions therefore define small areas or, taking into account the thickness of the superconducting film, small volumes of material representing minimum volumes per unit length of the detecting strip 64. Thus when the entire detecting strip is maintained near its critical temperature or critical current, the channel regions are most sensitive to increases in temperature caused, for example, by impinging particles, due to the fact that the current density in the channel regions is slightly higher than the current density elsewhere in the detecting strip. Accordingly, the channel regions provide zones of unique sensitivity and switching performance for detecting the impingement of particles.

Figure 5:
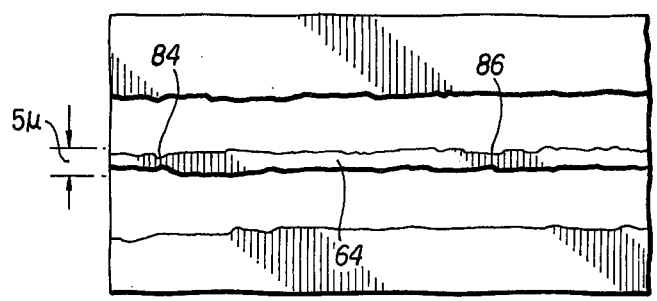
FIG. 5 is an illustration of a crude channel structure in a superconductive thin-film formed by a scratching technique.

The sensitivity of the thin-film apparatus of FIG. 5 to impinging nuclear particles can be understood by visualizing the effect of placing the detector strip 64 of FIG. 5 in the detector 18 as illustrated in FIG. 1. An ion beam is then directed at the detector strip. It will be apparent to those skilled in the art that if the energy of the impinging ion beam is sufficiently high, particles falling upon the detecting strip 64 will impart sufficient thermal energy to the detecting strip to drive it from its superconducting state to a normal state. However, high energy particles and high energy particle beams can be detected by a number of techniques, and thus the present invention is not directed to the detection of such particles. Rather, very low energy particles, that is particles having energies from as low as 10 up to a few hundred eV are of interest with respect to the present invention, since particles of such low energy levels could not be discretely detected reliably with apparatus available in the past. It has been discovered that such particles can be reliably detected by the apparatus of the present invention when they impinge upon the previously described channel regions. To understand the mechanism by which detection occurs, it must be understood that the detecting strip is initially operated near its critical temperature and with a bias current that is near the critical current for that temperature. When in such a near critical state, impingement of a low energy particle on the wide portion of the detecting strip will raise the temperature of a small circular area above the critical temperature so that this small region of the detecting strip will go normal for a brief interval and then return to the superconducting state. However, if this phenomenon occurs within the main body of the detecting strip, it will not produce a detectable change in the resistance across the detecting strip. However, if the impinging particle strikes within one of the designated channel regions, the small normal area created will occupy a significant percentage of the total volume of superconductive material within the channel region. This will cause the current flowing through the channel to be concentrated in the region of the channel which has not gone normal due to the impinging particle with the result that the current density in the remainder of the channel is increased above the critical current density so that the entire channel region goes normal for a brief interval. This phenomenon results in a clearly detectable change in the resistance of the film with the result that impingement of the particle can be detected by monitoring the voltage across or current through the detecting strip. This technique of particle detection has two significant aspects in addition to providing the capability of detecting discrete particles of extremely low energy levels. First, the output pulse height is independent of the particle energy over a significant energy range. The energy range is determined at its lower end by the minimum energy required to produce a normal area of sufficient size to drive the channel current above the critical level, and thus switch the entire channel region to its normal state. Similarly, the upper end of the constant output range is determined by the particle energy required to switch the entire channel region to its normal state upon impingement by a single particle, without need for relying upon the channel current going above its critical level. Any particle of more than this energy would tend to switch more than the channel region to the normal state, thus increasing the pulse height of the response. Second, the channel region which is switched to its normal state by the impinging particle returns to its superconducting state after a constant interval, thus producing a detectable output pulse having a fixed duration. This phenomenon is due to the fact that in each instance the same volume of superconductive material (i.e. the volume defined by the channel region) switches from the superconducting state to the normal state and back. Thus in each instance of switching the same amount of thermal energy must be lost by the channel region before it can return to its superconducting state. Loss of this same quantity of thermal energy requires the same interval in each instance due to thermal conduction between film and substrate, or some other process, resulting in equal duration pulses being generated each time a particle impinges upon the channel region.

Figure 7:
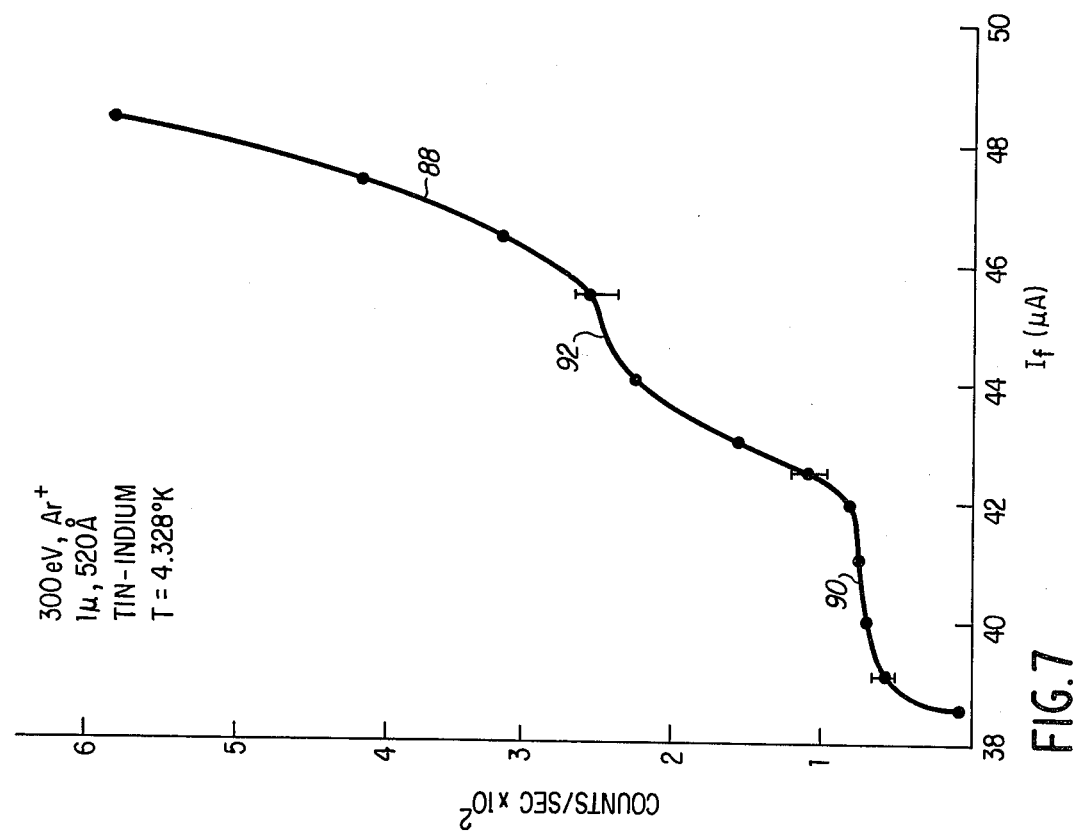
FIG. 7 is a graph representing detected particle counts per second versus film current.

Referring again to FIG. 5, it is noted that the two channel regions are formed by the somewhat arbitrary scratching process, and thus in normal cases do not have the same width and do not encompass equal volumes of superconductive material. Thus the two channels will be switched from superconducting to normal states by particles of different energies, or by particles of the same energies at different levels of bias current within the detecting strip. In this regard attention is directed to FIG. 7 which illustrates in graphical form the number of particle counts detected per second versus film current for a detecting strip of the type illustrated in FIG. 5. In FIG. 7, the curve 88 has a first relatively flat region 90 indicating that in this region the count rate per second does not increase even though the film current is increased significantly. This flat region indicates that only one of the two channels illustrated in the FIG. 5 detecting strip has a sufficient bias current so that the impinging particles (300 eV argon ions) have sufficient energy to cause that channel to go normal. A second flat region 92 occurs at a higher bias current, while between the two flat regions the count rate per second increases significantly. This increase in the count rate indicates that the critical or sensitive area of the detecting strip is increasing as the bias current increases. This means that a second channel region is becoming active in terms of being sensitive to impinging particles. At the second flat region 92, this second channel region is fully effective and is properly biased for particle counting.

Figure 6:
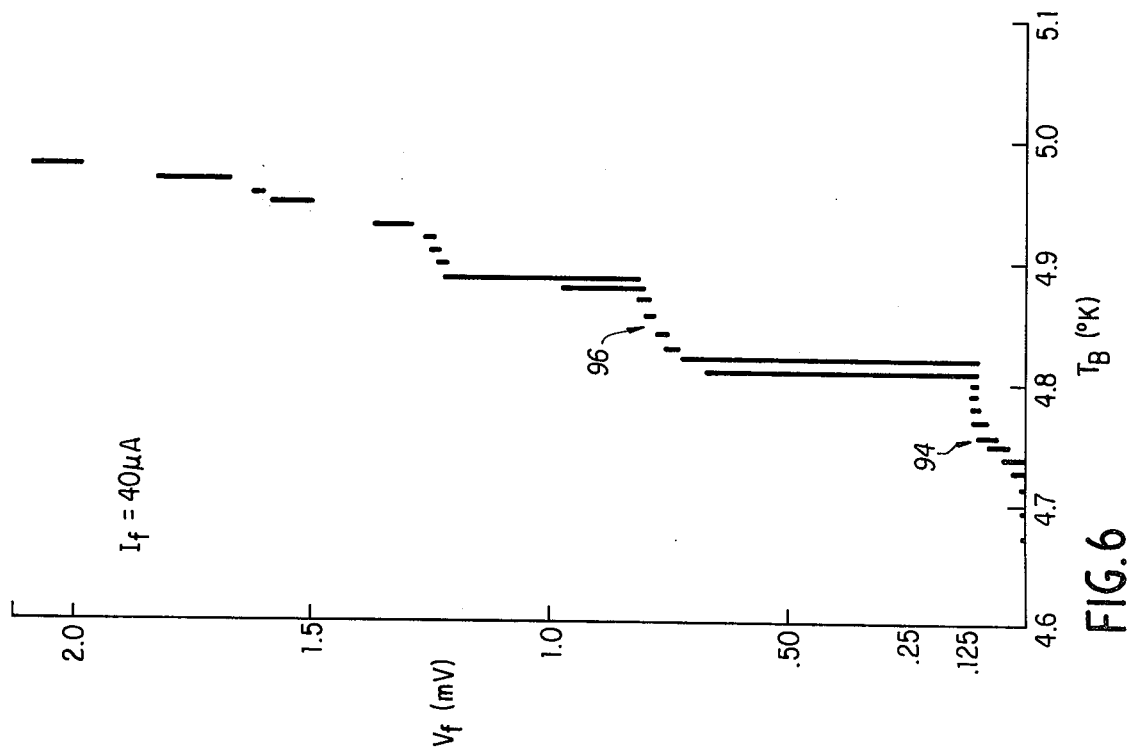
FIG. 6 is a graph illustrating the change in resistance of a thin-film as a function of temperature in the critical temperature range.

A similar effect is shown in FIG. 6 in which film current is maintained constant in a film of the type illustrated in FIG. 5, while the temperature of the film is increased. Two flat regions in the voltage-temperature characteristic curve are shown at 94 and 96 in the illustrated curve. These flat regions correspond to the flat regions illustrated in FIG. 7 and indicate that as the temperature of the film is increased, the two channel regions of differing widths suddenly switch from superconducting to normal states at discrete temperature levels, again emphasizing the fact that the channel regions behave in a distinct manner which differs from that of the detecting strip as a whole.

Referring again to FIG. 4, the procedures for investigating the particle detecting sensitivity of the superconducting thin-film of the present invention will now be described in greater detail. As the operation of the present apparatus involves switching from the superconducting state to the normal state, it is first necessary to study the behavior of the superconductive strip near its critical temperature and critical current density. Accordingly, once a superconductive detecting strip is formed, critical temperature curves are obtained by monitoring the voltage drop across the superconductor with the Keithley digital multimeter 68 while the current through the film is maintained constant. The Y-input of the X-Y recorder 78 is connected to an analog output of the multimeter 68 to provide a record of the voltage drop, while temperature input signals from the germanium sensor 46 are applied to the X-input of the recorder 78. The desired temperature near the critical temperature range is subsequently set using the above-described temperature controlling system.

Critical current curves for specific temperatures are obtained by monitoring the voltage drop across the film for various film currents while maintaining the temperature constant. Similarly, the relationship between critical current and temperature is obtained by monitoring the voltage drop across the film as the film current is slowly raised.

Once the critical current and temperature characteristics of a particular film are determined, the molecular ion beam is switched on and permitted to fall upon the film. The behavior of the voltage across the film is observed on the oscilloscope 70 as the film temperature and current are varied in the region just below critical conditions until proper incidence of the molecular beam is established. Once voltage pulses due to incidence of the beam are observed, the desired operating conditions of the films are set to render the films sensitive to incident particles of suitable energy. Pulses are counted by means of the counter 82 and pulse height is measured by means of the channel analyzer 76. The sensitivity of the film to ions and neutral particles is determined by first allowing the ionized beam to strike the film while observing the particle count rate, and subsequently permitting a neutralizing gas to enter the neutralizing cell 32 and switching on the collection plates 34, whereby only neutral particles are permitted to fall upon the film. Film sensitivity was found to be independent of particle charge, emphasizing the fact that switching of the film from superconductive to normal states is a function solely of the kinetic energy of the particles, and not of their electrical charge. The accelerating potential of the ion source may also be varied to test the sensitivity of the film to particles of differing energy levels. Using the above-described techniques output pulses of approximately $100\mu V$ height with a duration of 0.1 to 1.0 ms were recorded. The duration of the pulses is believed due to the thermal conduction process between the thin-film and the glass substrate. As noted previously, output pulse heights were found to be essentially the same for a wide range of particle energies i.e., for particles of energies between approximately 100eV and 1 keV. It is anticipated that the pulse height for some configurations of the present invention may remain linear for even larger ranges of particle energies.

The film detection strip structure illustrated in FIG. 5 and described above was primarily an experimental embodiment of the apparatus of the present invention and is described in detail to illustrate the basic concept of the present invention. Precise control of the channel dimensions, including width, length and thickness can be used to form films of specialized characteristics in terms of particle detecting sensitivity.

Figure 8:
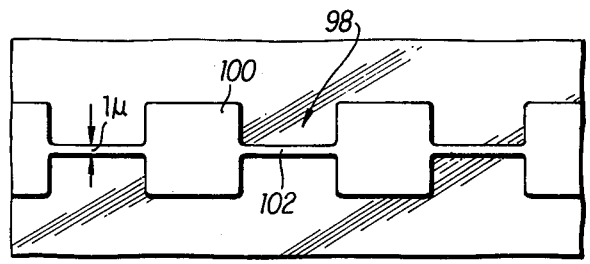
FIG. 8 is an illustration of a thin-film semiconductive strip having precisely formed channel regions.
Figure 9:
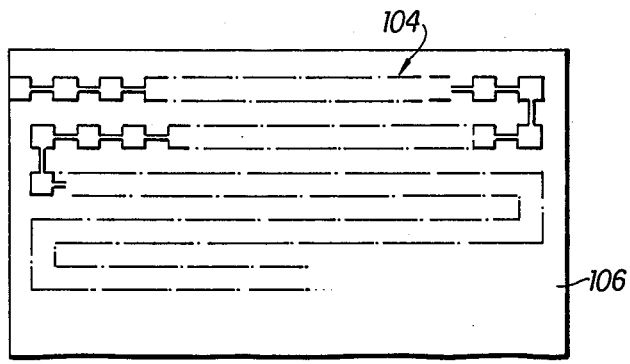
FIG. 9 is an illustration of a serpentine thin-film formed in the pattern illustrated in FIG. 8 to cover a large area substrate.

For example, attention is directed to FIG. 8 which shows a thin-film detecting strip 98 comprised of alternating wide regions 100 and narrow regions 102. The narrow regions which are illustrated as being in the range of one micron in width are equivalent to the previously described channel regions, while the wider regions 100 are spacer regions. The thickness of the film may also be varied through a suitable range, as will be apparent to those skilled in the art. Such a film can be formed conveniently by conventional ion-milling, vacuum deposition and photo-etching techniques. The resultant film illustrated in FIG. 8 includes a number of adjacent channel regions which can thus be used to provide an enlarged particle detecting area of great sensitivity. The particle detecting area can be greatly increased by forming a greatly elongated detection strip in the form of a serpentine path as illustrated at 104 in FIG. 9. The structure illustrated in FIG. 9 could thus be formed to occupy a relatively large area to enhance the discrete particle counting capabilities of the apparatus of the invention. Alternative to the structure illustrated in FIG. 4, the serpentine strips may be disconnected to form a series of parallel detecting strips along the illustrated substrate 106. In this instance, individual current supplies must be delivered to the separated detecting strips, so that the various detecting strips can be operated at either the same or at different bias currents. Thus, this arrangement provides additional flexibility in the particle counting sensitivity of the apparatus of the present invention.

Figure 10:
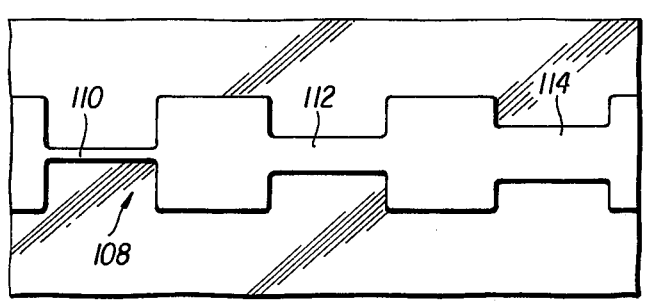
FIG. 10 is an illustration of a thin-film semiconductive strip having precisely formed channel regions of differing widths; and, FIG. 11 illustrates in block diagram form a self erasing digital memory utilizing a thin-film superconductive element of the type illustrated in FIG. 9.

Another embodiment of the invention is illustrated in FIG. 10, wherein a detecting strip 108 is formed having channels 110, 112 and 114 of progressively increasing width. The apparatus illustrated in the embodiment of FIG. 10 can thus also be produced to provide a range of sensitivities in a single detecting strip. Clearly, the varying channel width concept of FIG. 10 can be combined with the embodiments of the invention illustrated and described with respect to FIG. 9 to produce a wide variety of structures having a wide range of sensitivities to the energy of impinging particles. Varying the sensitivity of the apparatus to accommodate differing particle energies can also be accomplished by sweeping the bias current. Furthermore, it is noted that although discrete particles have been mentioned thus far as providing the switching energy for causing the channel regions to switch from superconducting to normal states, it will be apparent to those skilled in the art that any technique of providing minute quantities of thermal energy to the channel regions would have the same switching effect. Thus tiny laser beams and other equivalent sources of energy may also be used in accordance with the present invention.

Figure 11:
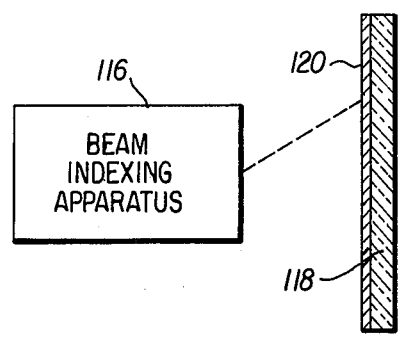

The present invention can be used to perform other functions than particle counting. For example, the unique ability of the apparatus to produce output pulses of fixed duration can be used to form a self-erasing digital memory of the type often used with digital computers. For example as illustrated in FIG. 11, a beam indexing apparatus of the type described by William C. Hughes et al. in a paper entitled "A Semiconductor Nonvolatile Electron Beam Accessed Mass Memory" published in the *Proceedings of the IEEE*, Vol. 63, No. 8, August 1975, pp. 1230–1240 may be used in combination with a substrate 118 having a pattern 120 of particle detecting channels formed thereon. The beam indexing apparatus can then be used to selectively switch the channel regions from their superconducting to their normal states. The inherent operation of the apparatus of the present invention will cause the channel regions to switch back to their superconductive states within a fixed interval, depending upon the dimensions of the particular channel regions.

Other areas of development and practical applications of the present invention include the following: reduction of minimum detectable energy to permit extremely low energy particles to be detected, stopping power studies of various gases cryosorbed on the detecting surface by forming layers of different gases on the supercooled detecting strip, the use of different types of superconducting materials and different shapes of channel regions and detecting strips.

It is to be noted that the same effect as varying the physical dimensions of the channel may be achieved by various techniques other than physically changing the dimensions, such as ion implantation techniques, to make a physically uniform width film effectively have any contour width desired by destroying or altering the superconductivity characteristics of a film in selected areas.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A thin-film superconductive apparatus sensitive to extremely small quantities of thermal energy comprising:
    a superconductive thin-film forming a narrow strip of non-uniform volume per unit length,
    said narrow strip including a main portion having a first average volume per unit length and a channel portion having a second average effective volume per unit length, said second average volume being less than said first average volume;
    bias circuit means coupled to said thin-film for passing a bias current through said film,
    temperature control means cooperating with said film for maintaining the temperature thereof within a predetermined superconductive range; and,
    monitoring circuit means coupled to said film for sensing changes in the resistance of said film.

2. A thin-film superconductive apparatus as in claim 1, wherein:
    said narrow strip is of substantially uniform thickness but of nonuniform effective width along its length.

3. A thin-film superconductive apparatus as in claim 1, wherein:
    said narrow strip includes a plurality of said channel portions.

4. A thin-film superconductive apparatus as in claim 3, wherein:
    said plurality of channel portions includes channel portions of differing average effective volumes per unit length.

5. A thin-film superconductive apparatus as in claim 2, wherein:
    said narrow strip includes at least one channel region of effective reduced width.

6. A thin-film superconductive apparatus as in claim 5, wherein:
    said narrow strip includes a plurality of said channel regions.

7. A thin-film superconductive apparatus as in claim 6, wherein:
    said plurality of channel regions include channel regions of differing effective widths.

8. A thin-film superconductive apparatus as in claim 6, wherein:
    said narrow strip is formed in a serpentine path on a substrate so as to cover a large surface area.

9. A thin-film superconductive apparatus as in claim 1, further comprising:
    energy beam producing means for directing an energy beam toward said superconductive thin-film.

10. A thin-film superconductive apparatus as in claim 9, wherein:
    said energy beam producing means includes a means for producing a beam of particles.

11. A thin-film superconductive apparatus as in claim 1, further comprising:

energy beam producing means for generating an energy beam, at least a portion of which falls upon said channel portion.

12. A thin-film superconductive apparatus as in claim 1, wherein:
said channel region is formed to include a predetermined effective volume of material so that it is driven from its superconducting to its normal state by the impingement of low energy particles.

13. A thin-film superconductive apparatus as in claim 12, wherein:
said channel region is formed such that the total volume of superconductive material therein when switched to its normal state returns to its superconducting state within a predetermined fixed interval.

14. A thin-film superconductive apparatus as in claim 13, wherein:
said fixed interval is in the range of from 0.1 to 1.0 millisecond.

15. A thin-film superconductive apparatus as in claim 3, further comprising:
beam indexing means for selectively directing a quantity of thermal energy toward an individual channel region for causing said channel region to switch from its superconducting state to its normal state for at least a predetermined time interval.

16. A thin-film superconductive apparatus as in claim 1, wherein:
said monitoring circuit includes a counting means for counting pulses produced by said channel portion being switched from its superconductive state to a normal state.

17. A thin-film superconductive apparatus sensitive to extremely small quantities of thermal energy comprising:
a superconductive thin-film including a narrow detecting strip including at least one spacer region having a first effective average volume of superconductive material per unit length and at least one channel region having a second effective average volume of superconductive material per unit length, said second effective average volume being less than said first effective average volume,
temperature control means cooperating with said thin-film for maintaining said film near its critical temperature,
biasing circuit means coupled to said film for passing a predetermined bias current through said detecting strip; and,
monitoring circuit means coupled to said film for detecting resistance changes when said channel region switches from its superconductive state to its normal state and back to its superconductive state.

18. A thin-filmed superconductive apparatus as in claim 17, further comprising:
means for selectively switching said channel region from its superconducting state to its normal state.

19. A thin-film superconductive apparatus as in claim 18, wherein:
said channel region is formed so as to automatically return to its superconducting state a fixed interval after being switched to its normal state.

20. A thin-film superconductive apparatus as in claim 19, wherein:
said monitoring circuit means includes counting means for determining the number of times said channel region changes state.

* * * * *

UNITED STATES PATENT AND TRADEMARK OFFICE
CERTIFICATE OF CORRECTION

PATENT NO. : 4,037,102
DATED : July 19, 1977
INVENTOR(S) : JOHN A. HOYLE ET AL

It is certified that error appears in the above-identified patent and that said Letters Patent are hereby corrected as shown below:

Column 1, line 4, after "BACKGROUND OF THE INVENTION", please insert the following new paragraph:

--The invention described herein has been made in the course of or as a result of a contract from the National Science Foundation.--

Signed and Sealed this

Fifth Day of September 1978

[SEAL]

Attest:

RUTH C. MASON
*Attesting Officer*

DONALD W. BANNER
*Commissioner of Patents and Trademarks*